(12) United States Patent
Chen et al.

(10) Patent No.: US 7,696,580 B2
(45) Date of Patent: Apr. 13, 2010

(54) DIODE AND APPLICATIONS THEREOF

(76) Inventors: Zi-Ping Chen, No. 58, Guangming St., Shindian City, Taipei, Taiwan 231 (CN); Ming-Dou Ker, 4F-3, No. 3, Lane 200, Pao-Shan Rd., Lin 8, Kao-Feng Li, E. District, Hsinchu 300, Taiwan (CN)

( * ) Notice: Subject to any disclaimer, the term of this patent is extended or adjusted under 35 U.S.C. 154(b) by 137 days.

(21) Appl. No.: 12/118,364

(22) Filed: May 9, 2008

(65) Prior Publication Data
US 2008/0203424 A1 Aug. 28, 2008

Related U.S. Application Data

(63) Continuation of application No. 11/004,348, filed on Dec. 3, 2004, now Pat. No. 7,372,109.

(30) Foreign Application Priority Data
Aug. 30, 2004 (TW) ............................... 93126050 A

(51) Int. Cl.
*H01L 27/06* (2006.01)
(52) U.S. Cl. ................. 257/370; 257/E27.016
(58) Field of Classification Search .............. 257/173, 257/355, 370–372, E27.016
See application file for complete search history.

(56) References Cited

U.S. PATENT DOCUMENTS

| 5,892,264 A | 4/1999 | Davis et al. |
| 6,191,451 B1 * | 2/2001 | Nowak et al. ............... 257/347 |
| 6,348,372 B1 * | 2/2002 | Burr ........................... 438/223 |
| 6,385,028 B1 * | 5/2002 | Kouno ........................ 361/111 |
| 6,670,677 B2 * | 12/2003 | Choe et al. .................. 257/355 |
| 6,693,331 B2 * | 2/2004 | Mistry et al. ................ 257/369 |
| 6,878,605 B2 | 4/2005 | Kim et al. |
| 7,095,092 B2 | 8/2006 | Zhu et al. |
| 2002/0109190 A1 | 8/2002 | Ker et al. |
| 2002/0153586 A1 | 10/2002 | Majumdar et al. |
| 2003/0047750 A1 | 3/2003 | Russ et al. |

OTHER PUBLICATIONS

Chen, Shiao-Shien, et al., "Characteristics of Low-Leakage Deep-Trench Diode for ESD Protection Design i 0.18-μm SiGe BiCMOS Process," Electron Devices, IEEE, vol. 50, Issue 7, pp. 1683-1689, Jul. 2003.
Chen, Shiao-Shien, et al., "Low-Leakage Diode String Designs Using Triple-Well Technologies for RF-ESD Applications," Electron Device Letters, IEEE, vol. 24, Issue 9, pp. 595-597, Sep. 2003.
Voldman, S.H., "ESD Protection in a Mixed Voltage Interface and Multi-Rail Disconnected Power Grid Environment in 0.50 and 0.25-μm Channel Length CMOS Technologies," 1994.

(Continued)

*Primary Examiner*—Nathan W Ha

(57) ABSTRACT

A diode with low substrate current leakage and suitable for BiCMOS process technology. A buried layer is formed on a semiconductor substrate. A connection region and well contact the buried layer. Isolation regions are adjacent to two sides of the buried layer, each deeper than the buried layer. The isolation regions and the buried layer isolate the connection zone and the well from the substrate. The first doped region in the well is a first electrode. The well and the connection region are electrically connected, acting as a second electrode.

46 Claims, 18 Drawing Sheets

OTHER PUBLICATIONS

Dabral, et al., "Designing On-Chip Power Supply Coupling Diodes for ESD Protection and Noise Immunity," 1993, 11 pages.

Dabral, et al., "Core Clamps for Low Voltage Technologies," 1994, 9 pages.

* cited by examiner

DIODE AND APPLICATIONS THEREOF

This application is a continuation of and incorporates by reference in its entirety U.S. patent application Ser. No. 11/004,348, filed Dec. 3, 2004 now U.S. Pat. No. 7,372,109, which in turn claims the benefit of priority of Taiwanese application 93126050, filed Aug. 30, 2004. The present application claims the benefit of priority of both applications.

BACKGROUND

The present invention relates in general to a diode providing electrostatic discharge (ESD) protection, and in particular to a diode manufactured by bipolar complementary metal oxide semiconductor (BiCMOS) processes.

Among ESD protection devices, a diode has one of the simplest structures. Properly forward biasing a diode during an ESD event requires only a small silicon area for effective protection. FIG. 1 is a cross section of a conventional diode formed with a heavy-doped P-type (P+) region and an N-type well (NW).

FIG. 2 shows a conventional diode string, connected between high voltage ($V_{high}$) and low voltage ($V_{low}$) power lines, serving as an ESD protection device. The conventional diode string consists of several diodes connected in series. As shown in FIG. 2, a parasitic Darlington amplifier is formed in the diode string by the series-connected parasitic PNP bipolar transistors (BJTs), resulting in substrate current leakage forward to the grounded P-type (P) substrate. This substrate current leakage becomes more severe when operating temperature or diode number in the diode string increases.

There are several solutions for substrate current leakage. FIG. 3 shows a conventional circuit schematic suppressing substrate current leakage, in which the bias circuit 8 conducts a small amount of forward current to a lower portion of a diode string. Experimental results from the circuit indicate that, at high temperature, substrate current leakage still occurs at significant magnitude.

Another solution involves modification of the structure of each diode. By lowering the common-base gain of each parasitic BJT, the overall current gain of a Darlington amplifier is decreased, reducing substrate current leakage. Alternatively, eliminating formation of a Darlington amplifier, the substrate current leakage of a diode string may be substantially diminished. FIG. 4 shows a diode string with diodes of an exemplary diode structure. In comparison with the diode of FIG. 1, each diode in FIG. 4 has not only a P+ region and an NW, but also a deep NW under the NW. The common-base current gain of each parasitic BJT is reduced by the enlarged base width thereof. The overall current gain of a Darlington amplifier is accordingly decreased, and the substrate current leakage is reduced.

FIG. 5 shows another diode string in which, for each diode, the P-type well (PW) is completely enclosed by an NW and a deep NW. Through a wire connection, the voltage potentials of the NW and the deep NW are the same as that of the anode of the enclosed diode. In FIG. 5, because the base and emitter of each parasitic PNP BJT are at the same voltage potential and the emitter, the PW, has much lower doped concentration, the common-base current gain of each parasitic PNP BJT is decreased, such that each parasitic PNP BJT is difficult to activate. Furthermore, the Darlington amplifier is not formed, due to the modification of the diode structure, improving substrate current leakage.

The diodes in FIGS. 4 and 5 are suitable for CMOS semiconductor processes providing formation of a deep NW. However, with regard to a diode string with ESD protection for SiGe BiCMOS processes, the diode string in FIG. 6 is generally utilized. In FIG. 6, each diode has a heavy-doped N-type (N+) buried layer 94. Because the emitter, the PW 90, has a much lower doping concentration, the common-base current gain of each parasitic PNP BJT is decreased. Furthermore, the Darlington amplifier is not formed, due to modification of the diode structure. Both results improve substrate current leakage.

SUMMARY

Embodiments of the present invention provide a diode with low substrate current leakage. The diode comprises a semiconductor substrate, a buried layer, a well, a connection region, two isolation regions, and a first doped region. The semiconductor substrate is of a first conductivity type. The buried layer is formed on the semiconductor substrate and of a second conductivity type opposite to the first conductivity type. The well is of the first conductivity type, formed on the buried layer. The connection region is of the second conductivity type, formed on the buried layer and contacting the buried layer. The two isolation regions are respectively formed at two sides of the buried layer, each deeper than the buried layer. The isolation regions, together with the buried layer, isolate the well and the connection region from the semiconductor substrate. The first doped region is of the second conductivity type and, on the well, acts as a first electrode of the diode. The connection region and the well are electrically connected to each other, acting as a second electrode of the diode.

The first conductivity type can be P-type and the second conductivity type N-type.

The connection region can be a sinker or another well.

Each isolation region can consist of a single deep trench or one deep trench and a shallow trench.

On the surfaces of the connection region and the well, second and third doped regions can be formed as electrical contacts.

The second and third doped regions can be connected via a wire connection or a silicide layer on the surfaces thereof.

A shallow trench or dummy gate can be formed between each two doped regions for electrical isolation.

The invention also provides an ESD protection circuit with a diode string. The ESD protection circuit can be employed in an input/output (I/O) port or between two power rails.

The voltage potential of a buried layer is the same as the anode of a diode on the buried layer, resulting in a parasitic BJT with a base and emitter of the same voltage potential. This parasitic BJT is difficult to activate during normal operation and has a lower common-base current gain, and, there no Darlington amplifier is formed in a diode string utilizing the diode of the invention.

BRIEF DESCRIPTION OF THE DRAWINGS

The invention can be more fully understood from the detailed description given hereinbelow and the accompanying drawings, given by way of illustration only and thus not intended to be limitative.

DESCRIPTION

Figure 7:
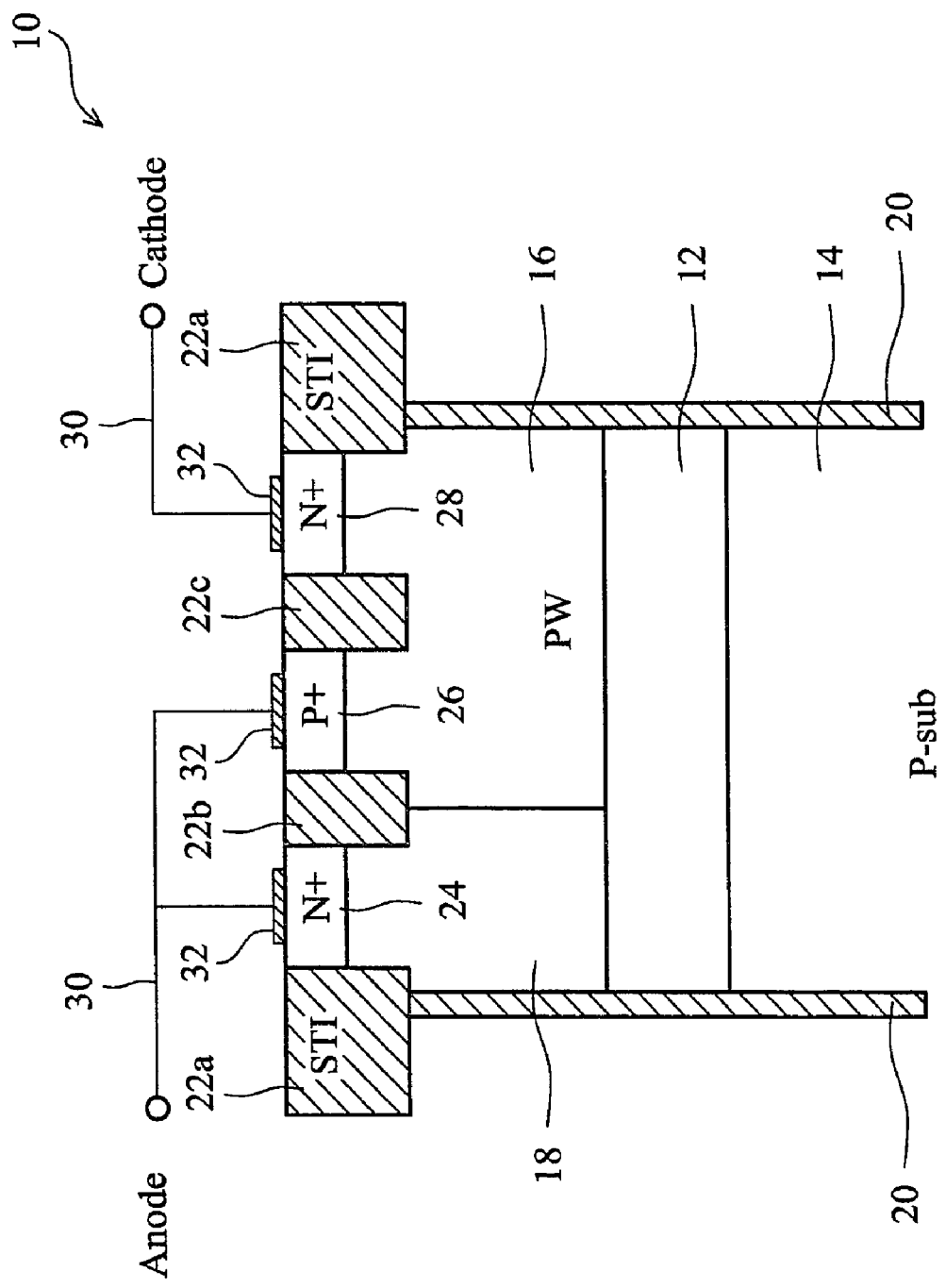
FIG. 7 shows a diode according to embodiments of the present invention.

FIG. 7 shows a diode according to embodiments of the present invention, manufactured by bipolar complementary metal oxide semiconductor (BiCMOS) processes. Diode 10 comprises a P substrate 14, an N+ buried layer 12, a P well (PW) 16, an N+ sinker 18, N+ regions 24 and 28, a P+ region 26, two deep trenches 20 and several shallow trenches 22~.

N+ buried layer 12 is disposed on the P substrate 14. PW 16 and N+ sinker 18 are disposed on N+ buried layer 12 and generally formed in an epitaxy silicon layer of a BiCMOS process.

N+ region 24 serves as an electrical contact for N+ sinker 24, and P+ region 26 as an electrical contact for PW 16. On each surface of N+ regions 24 and 28, and P+ region 26, a silicide layer 32 enhances conductivity of each region. Through a wire connection 30, N+ region 24 and P+ region 26 are electrically connected to each other and to other circuits. PW 16, N+ sinker 18 and N+ buried layer 12 thus have the same voltage potential. Wire connections 30 generally consist of contacts, metal lines, vias and the like. Similarly, N+ region 28 can be connected to other circuits through another wire connection 30.

N+ region 28 is formed in PW 16, simultaneously forming a PN junction therein. N+ region 28 thus acts as a cathode of a diode, and PW 16 or its electrical contact, P+ region 26, as an anode of the diode.

In FIG. 7, an isolation region exemplarily comprises a shallow trench 22a and a deep trench 20, both of isolation material, such as silicon dioxide. Each deep trench 20 is deeper than N+ buried layer 12. The cross section in FIG. 7 shows deep trenches 20 respectively contacting two sides of N+ buried layer 12. A top view of the diode in FIG. 7, however, may show that the two deep trenches 20 are in the same isolation zone enclosing the entire N+ buried layer 12.

These two isolation regions, each comprising a deep trench 20 and a shallow trench 22a, together with N+ buried layer 12, electrically isolate PW 16 from P substrate 14. Shallow trench 22c isolates P+ region 26 from N+ region 28, and shallow trench 22b isolates P+ region 26 from N+ region 24.

Figure 1:
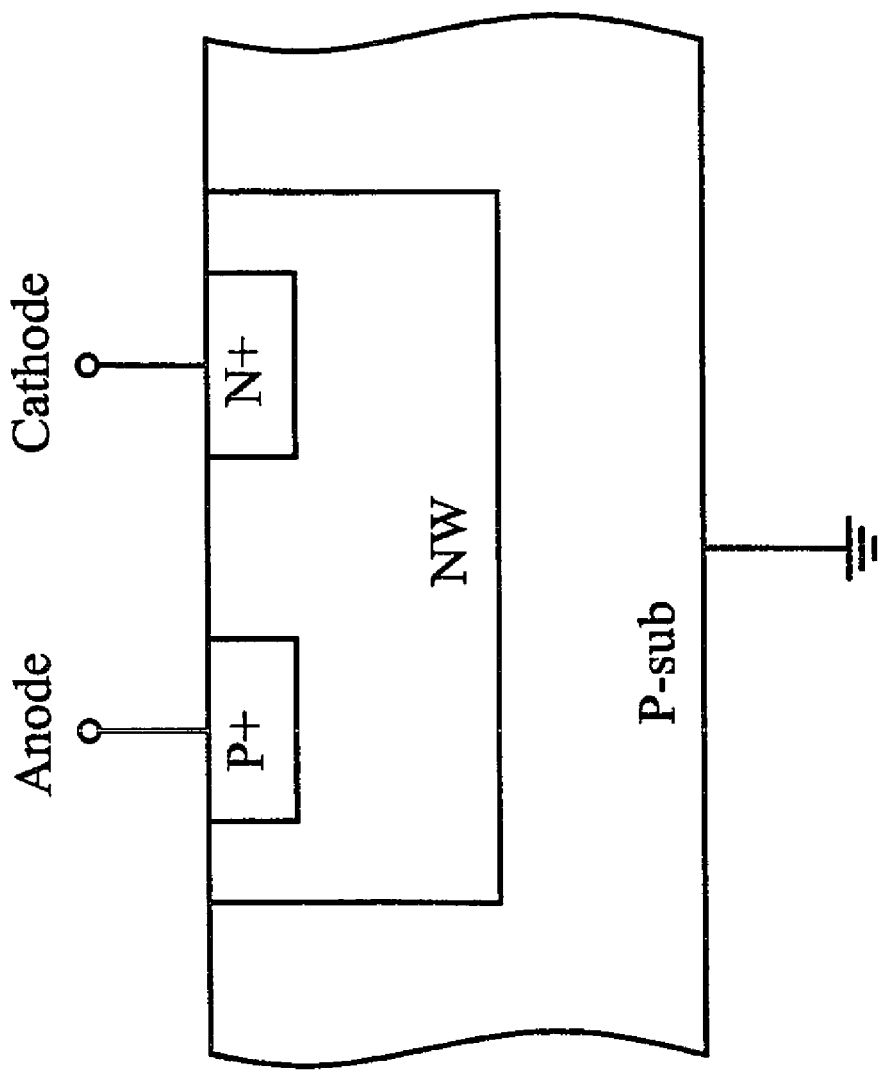
FIG. 1 is a cross section of a conventional diode formed with a heavy-doped P-type region and an N-type well.
Figure 2:
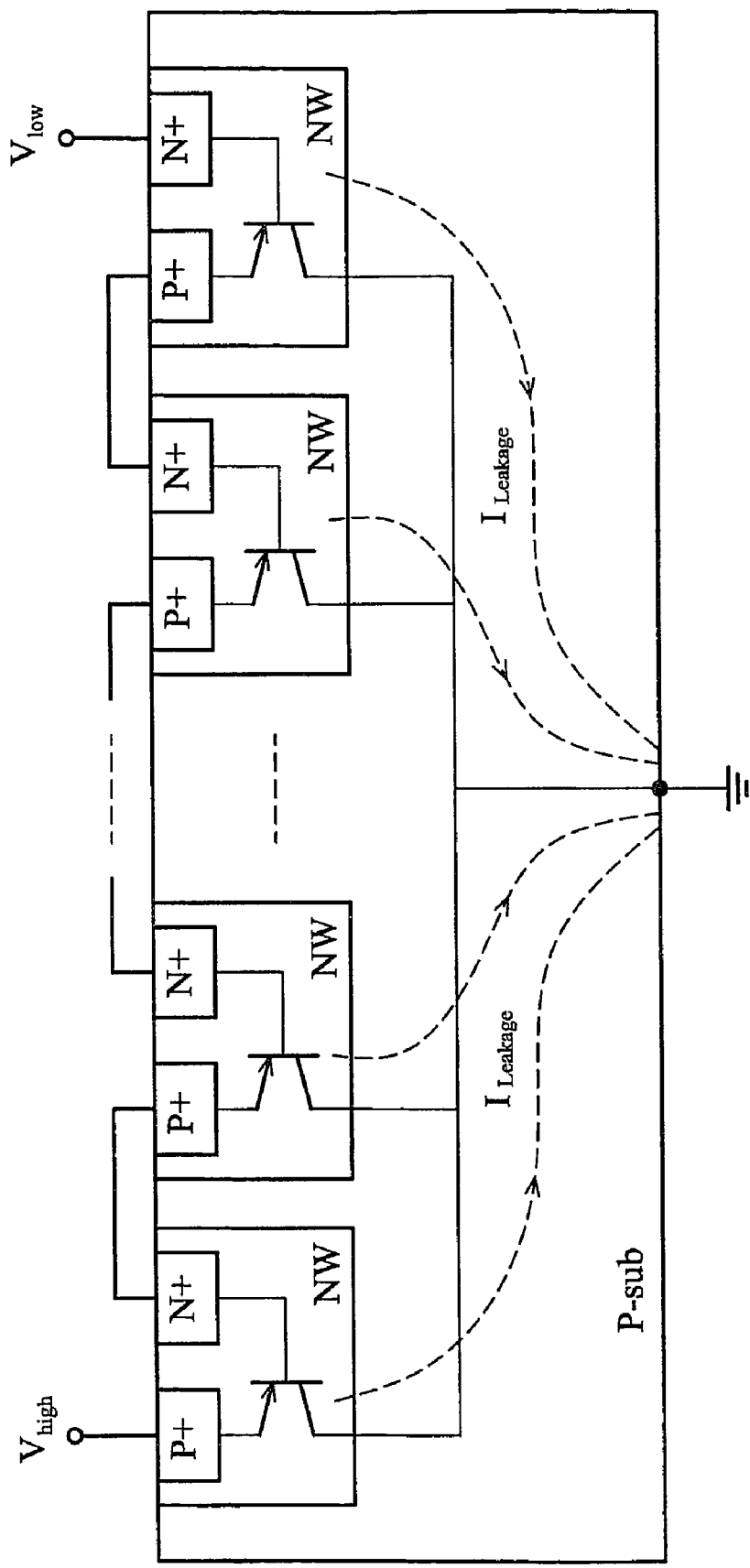
FIG. 2 shows a conventional diode string.
Figure 3:
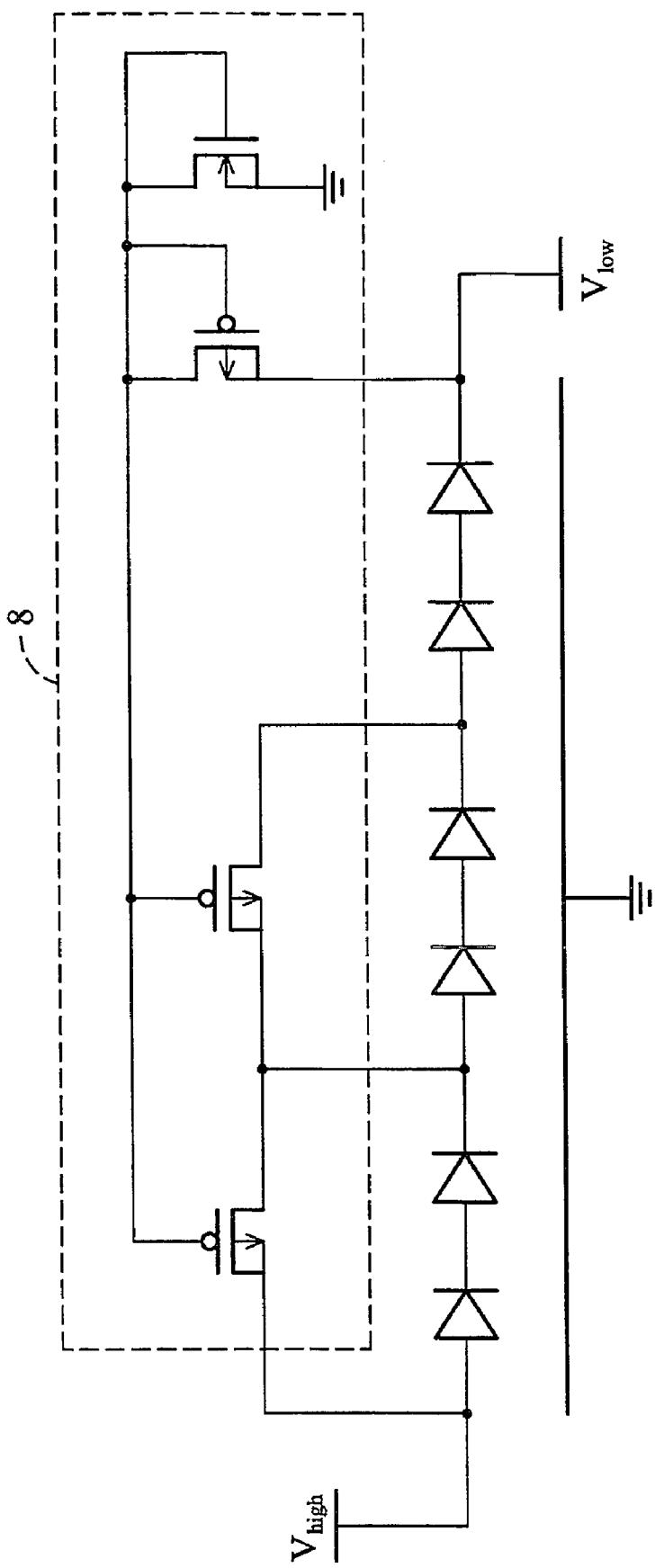
FIG. 3 shows a conventional circuit schematic.
Figure 4:
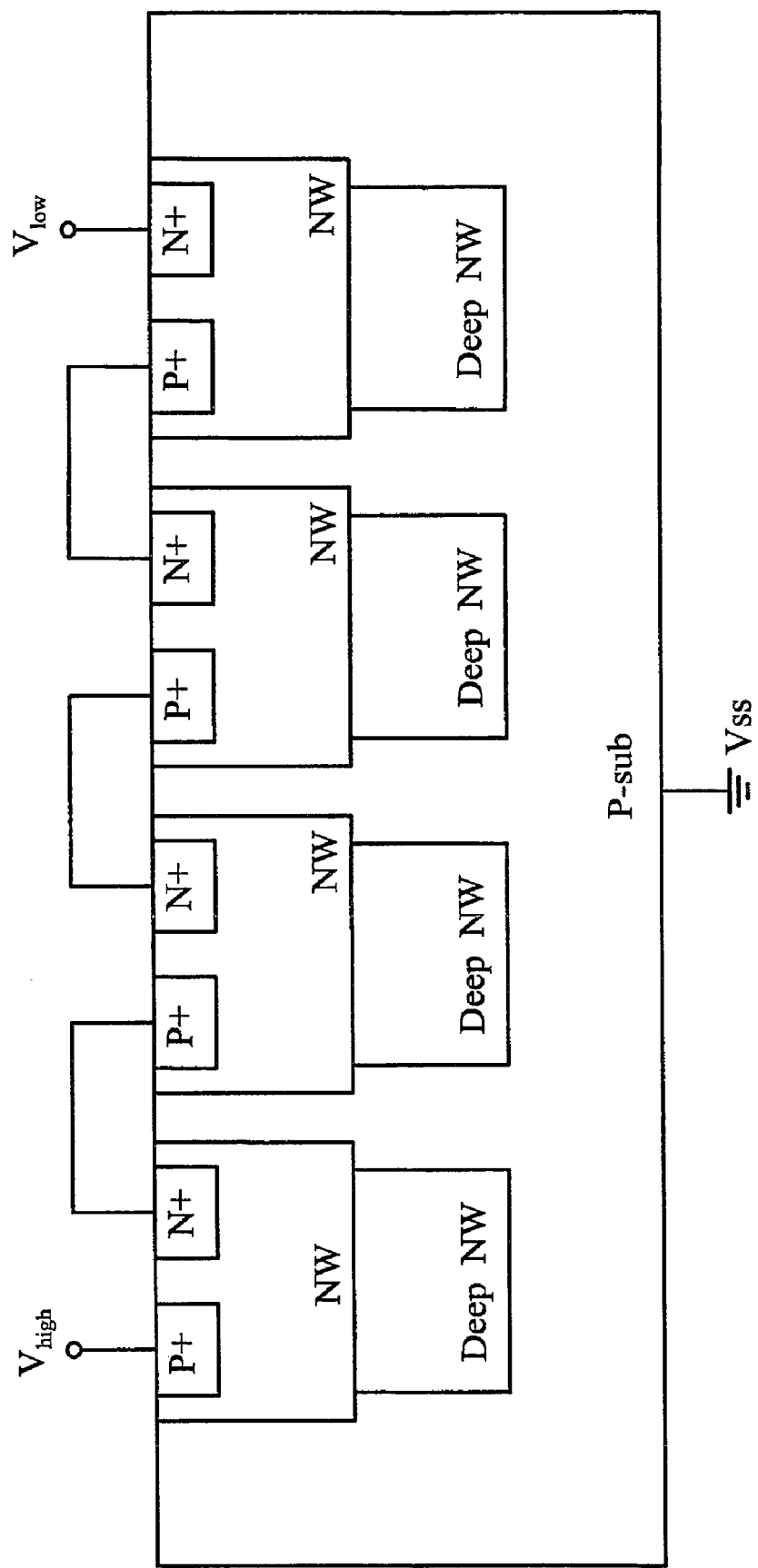
FIG. 4 shows a diode string with diodes of an exemplary diode structure.
Figure 5:
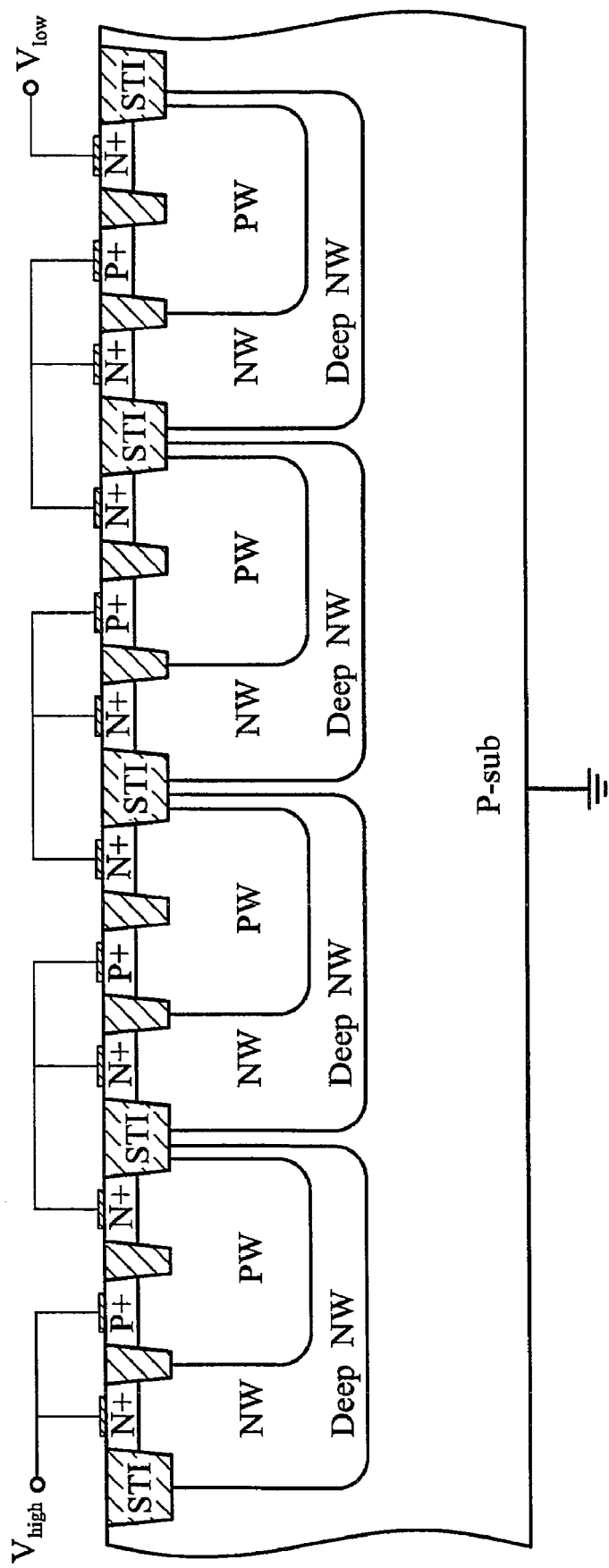
FIG. 5 shows another diode string with diodes of an exemplary diode structure.
Figure 6:
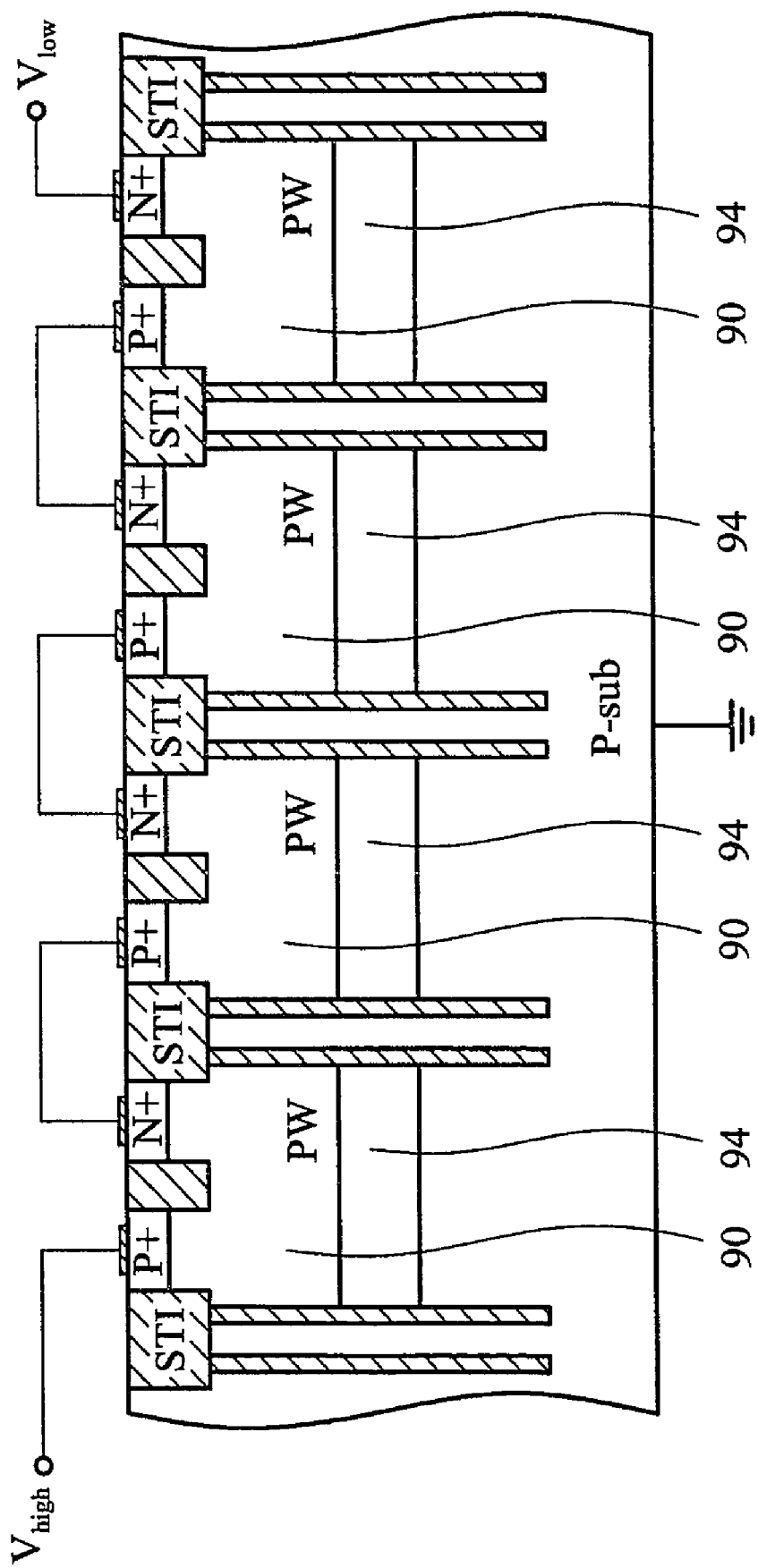
FIG. 6 shows a conventional diode string applicable in SiGe BiCMOS processes.

In related art FIG. 6, N+ buried layer 94 is not connected to PW 90, such that its potential should be lower than that of PW 90. This voltage difference, about that to turn on a PN junction, eases to turn on the parasitic PNP BJT, resulting in significant substrate current leakage. Nonetheless, in FIG. 7, since PW 16 and N+ buried layer 12 have the same voltage potential, no voltage difference is induced between the emitter and the base of the parasitic PNP BJT, consisting of PW 16, N+ buried layer 12 and P substrate 14. This parasitic PNP BJT is difficult to activate, in addition to much smaller the common-base current gain, causing little substrate current leakage.

The most significant differences between an N+ buried layer of a BiCMOS process and a deep NW of a CMOS process are the functions provided. Generally, in a CMOS circuit, a deep NW provides isolation of a PW and a P substrate. In a BiCMOS circuit, in addition to isolation between a PW and a P substrate, an N+ buried layer usually acts a sub-collector, connecting the collector of a BJT. Accordingly, an N+ burier layer requires low resistance and is heavily doped to reduce sheet resistance. A deep NW, in order to provide adequate isolation, is generally lightly doped to enlarge the junction breakdown voltage between itself and a P substrate. As an example, for a 0.18 um BiCMOS process, the dosage concentration of an N+ burier layer is about $10^{15}/cm^2 \sim 10^{17}/cm^2$, and for a comparable 0.18 um CMOS process, the dosage concentration of an deep NW is about $10^{13}/cm^2 \sim 10^{15}/cm^2$.

N+ sinker 18 in FIG. 7 can be replaced by a NW with lighter dosage concentration, capable to connect N+ buried layer 12 and PW to the same voltage potential.

Figure 8:
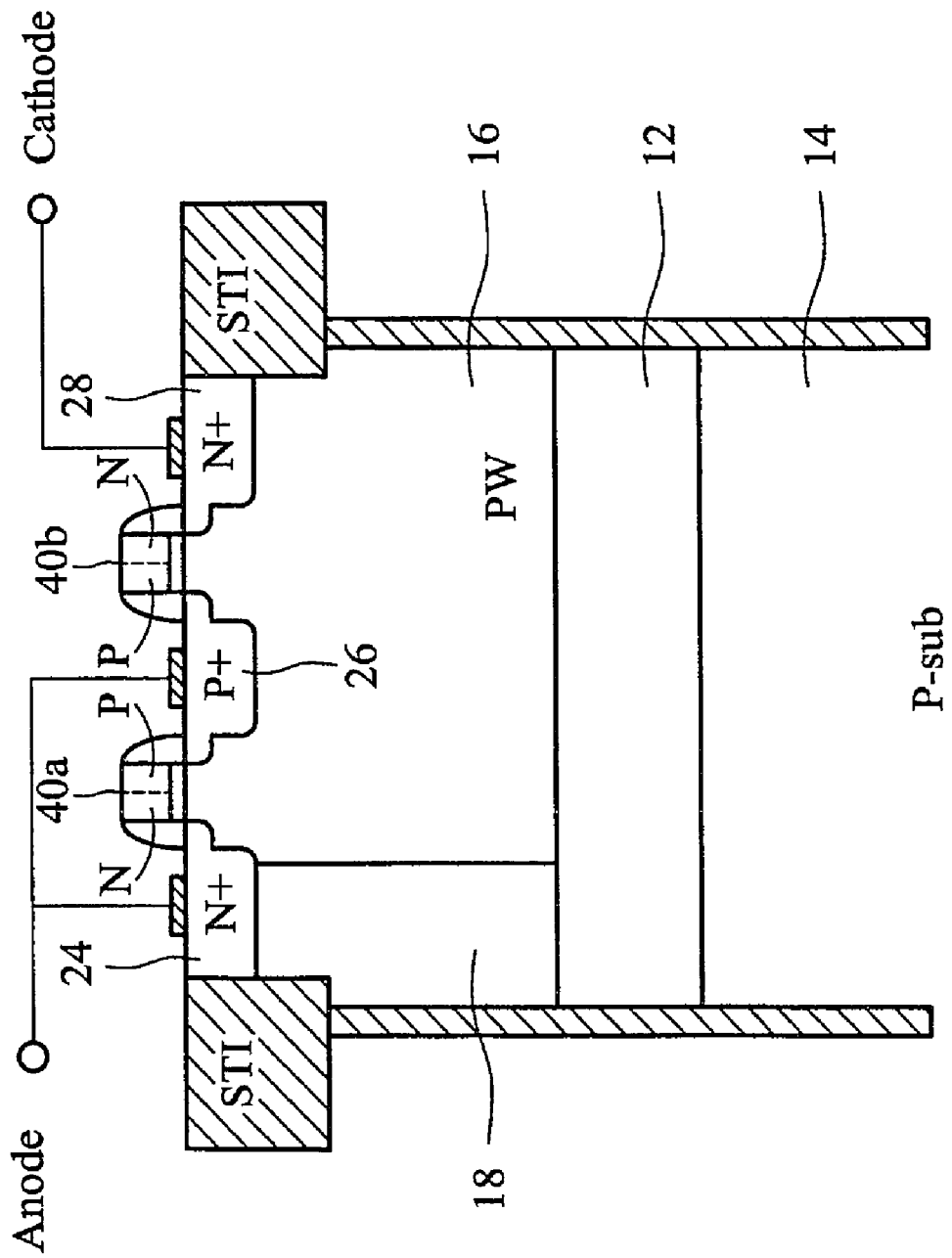
FIGS. 8 and 9 show two other diodes according to embodiments of the present invention.

FIG. 8 shows another diode structure according to embodiments of the present invention. Unlike the two shallow trenches 22c and 22b shown in FIG. 7, which isolate N+ region 24, P+ region 26 and N+ region 28, in FIG. 8, they are respectively replaced by two dummy gates 40a and 40b. Each dummy gate has a polysilicon gate. During ion implantation to form N+ regions 24 and 28, a portion of the polysilicon gate adjacent to a N+ region is simultaneously doped into N-type doped polysilicon. During ion implantation to form P+ region 26, a portion of the polysilicon gate adjacent to a P+ region is simultaneously doped into P-type doped polysilicon, as shown in FIG. 8.

Figure 9:
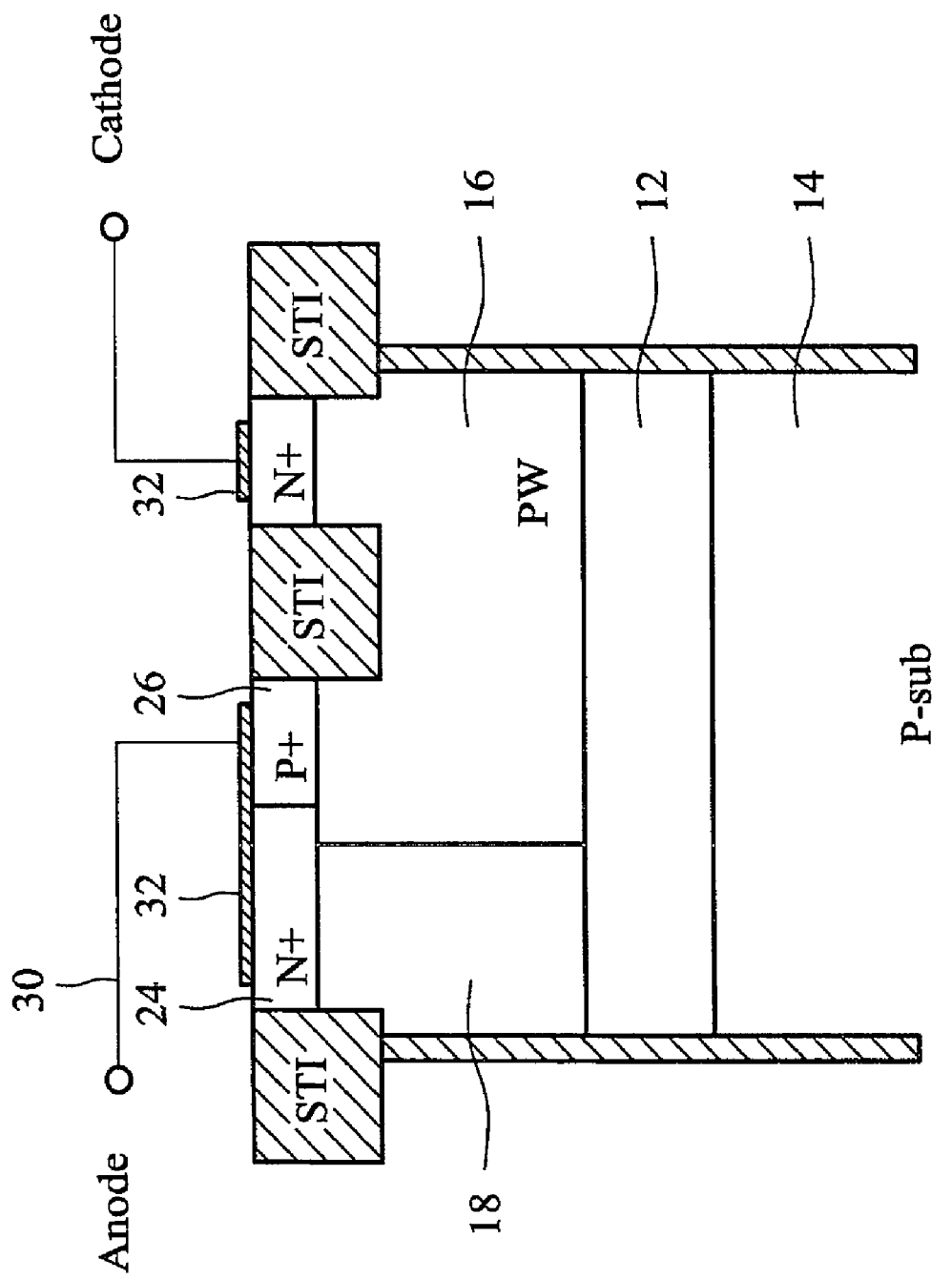

The shallow trench or dummy gate between P+ region 26 and N+ region 24 can be omitted to conserve space. FIG. 9 shows another diode according to embodiments of the present invention. Unlike FIG. 7, FIG. 9 lacks shallow trench 22c. As shown in FIG. 9, a silicide layer 32 on surfaces of P+ region 26 and N+ region 24 shorts them. Hence, the wire connection 30 for P+ region 26 and N+ region 24 requires only a contact hole for necessary connection to the anode of a diode.

Figure 10:
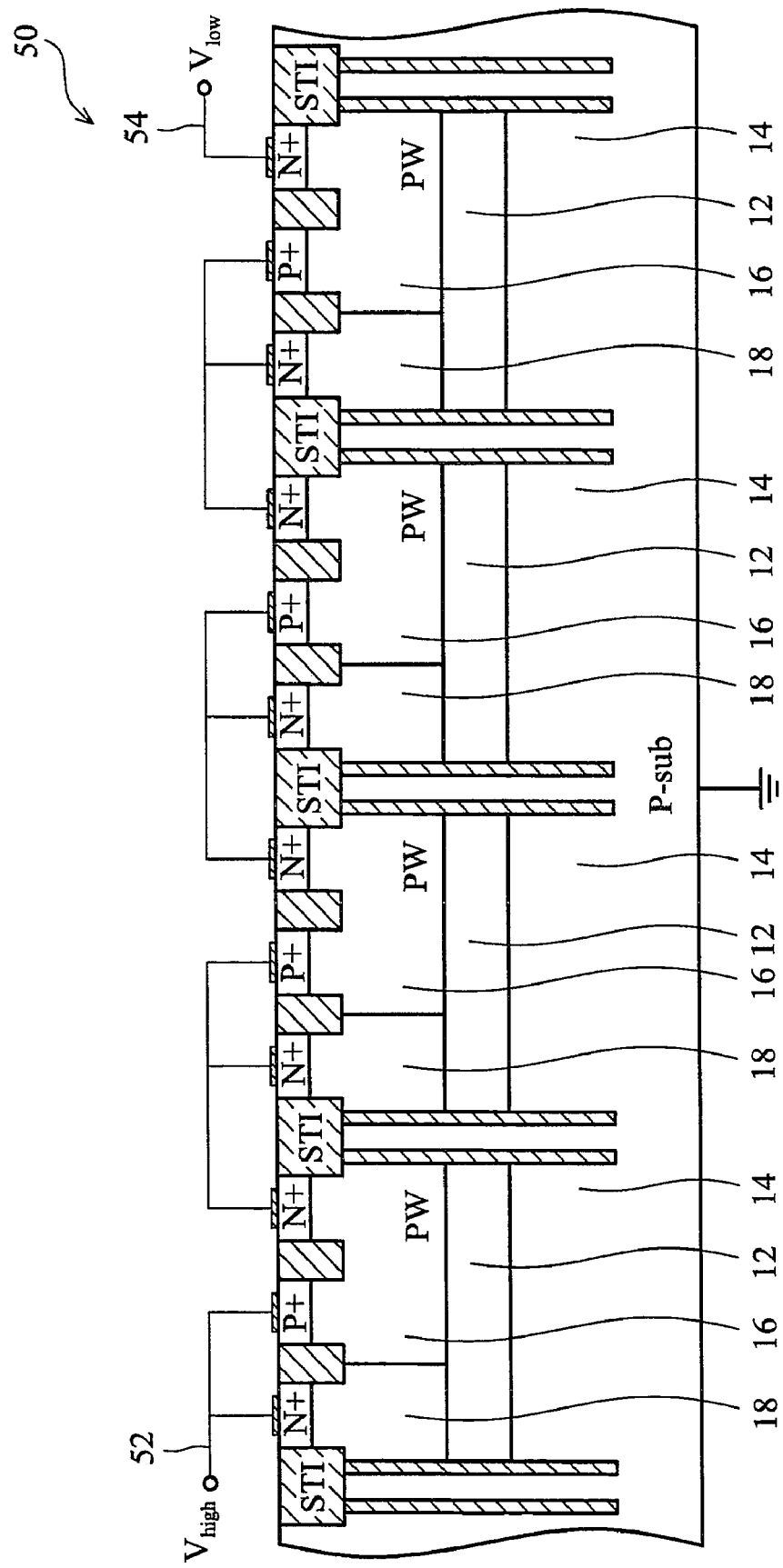
FIG. 10 shows a diode string 50 utilizing the diode in FIG. 7.

FIG. 10 shows a diode string 50 utilizing the diode in FIG. 7. In FIG. 10, the diode string 50 consists of 4 diodes forward connected in series, wherein an anode of a diode is connected to a cathode of another diode, whose anode is connected to a cathode of another diode, such that, each diode has the same polarity. The diode string 50 thus acts as a compound diode having an activation voltage equal to the sum of all the activation voltages of the diodes therein, a major anode at the anode of the first diode in the diode string 50, and a major cathode at the cathode of the last diode in the diode string 50. While in FIG. 10, the number of the diodes is 4. The disclosure is not limited thereto. In application, the number of diodes forward connected in series is determined by, and proportional to, activation voltage required for the diode string.

Acting as an ESD protection device, the major anode and cathode of the diode string 50 are generally coupled to metal lines 52 and 54, respectively, with voltage potential of the metal line 52 normally exceeding that of the metal line 54. For example, when the metal line 52 is a high voltage power rail, the metal line 54 can be a low voltage power rail or an input/output (I/O) pad of an input/output port. When the metal line 54 is a low voltage power rail, the metal line 52 can be a high voltage power rail or an input/output pad of an input/output port.

Figure 11:
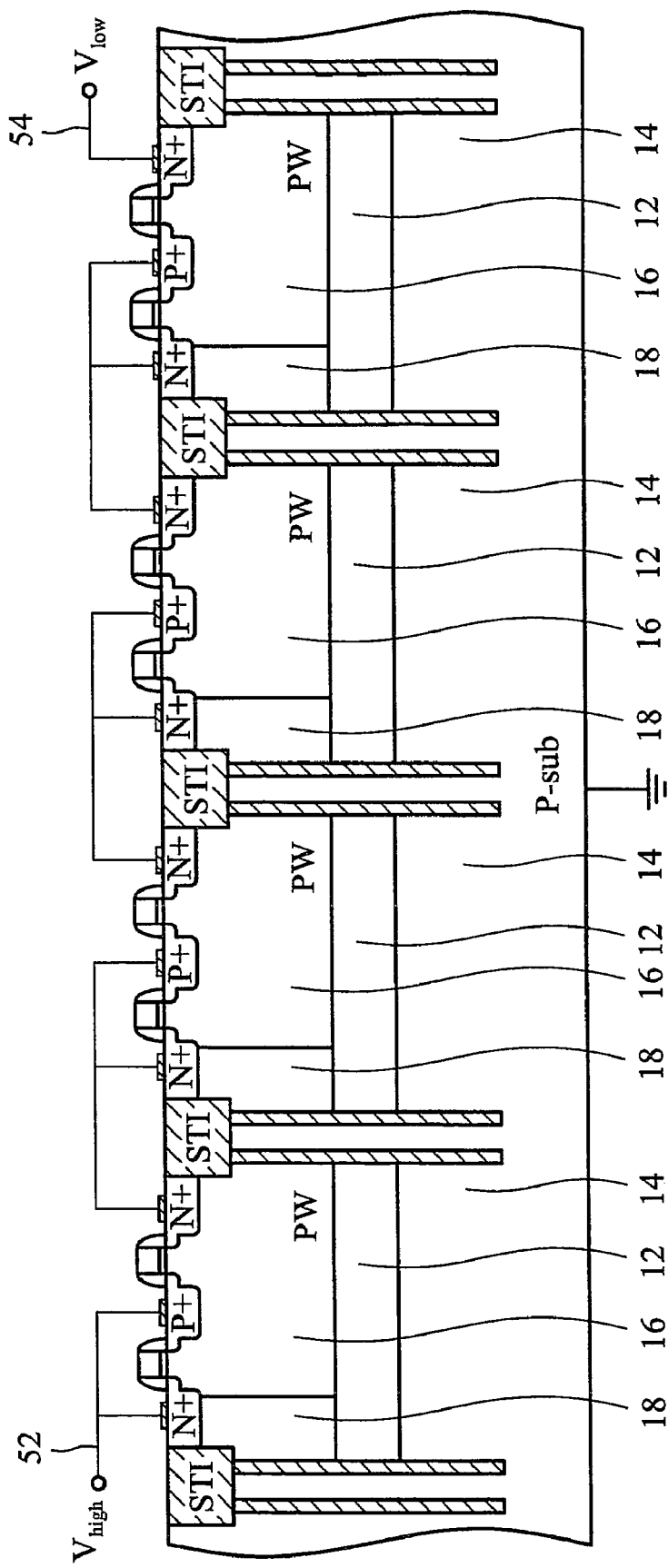
FIGS. 11 and 12 show two diode strings utilizing the diodes in FIGS. 8 and 9, respectively.
Figure 12:
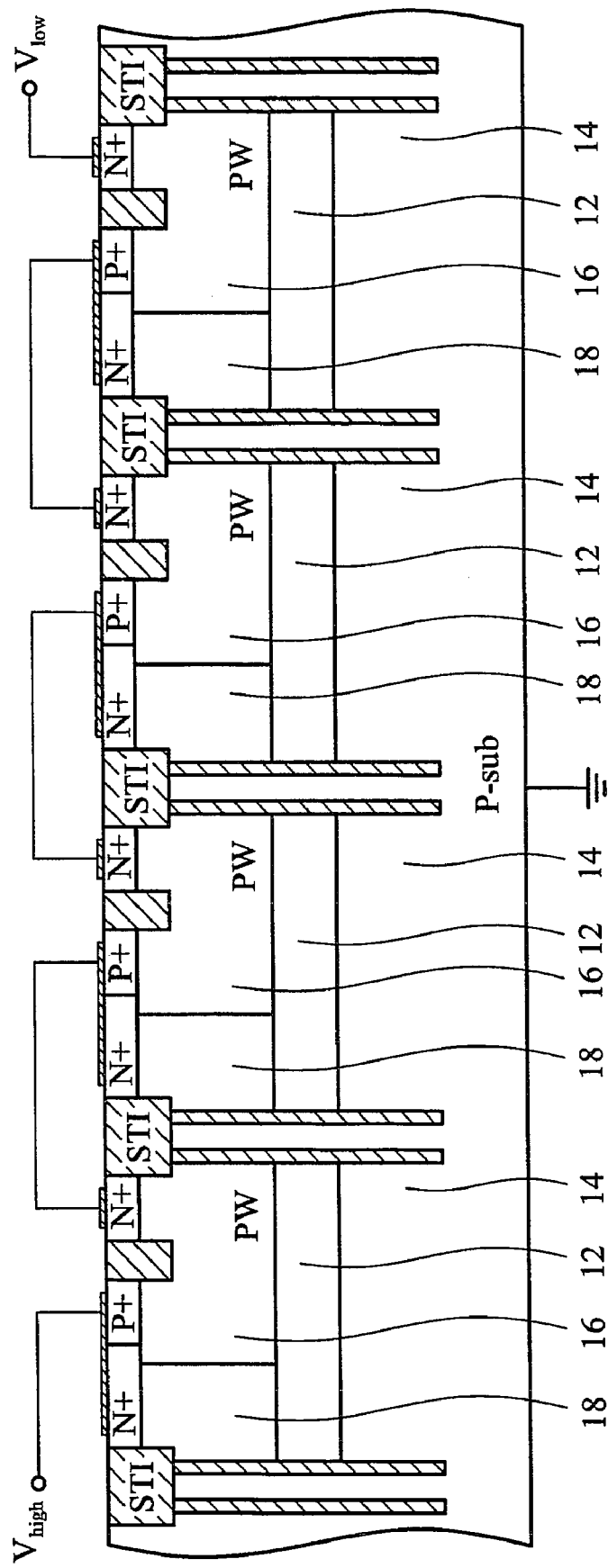

FIGS. 11 and 12 snow diode strings utilizing the diode structures in FIGS. 8 and 9, respectively, and are self-explanatory to a person skilled in the art.

There is no requirement that all the diodes in a diode string have the same diode structure. Each diode in a diode string can have an unique diode structure. For example, a diode of FIG. 7 can be forward connected in series with a diode of FIG. 9 to from a diode string.

Figure 13B:
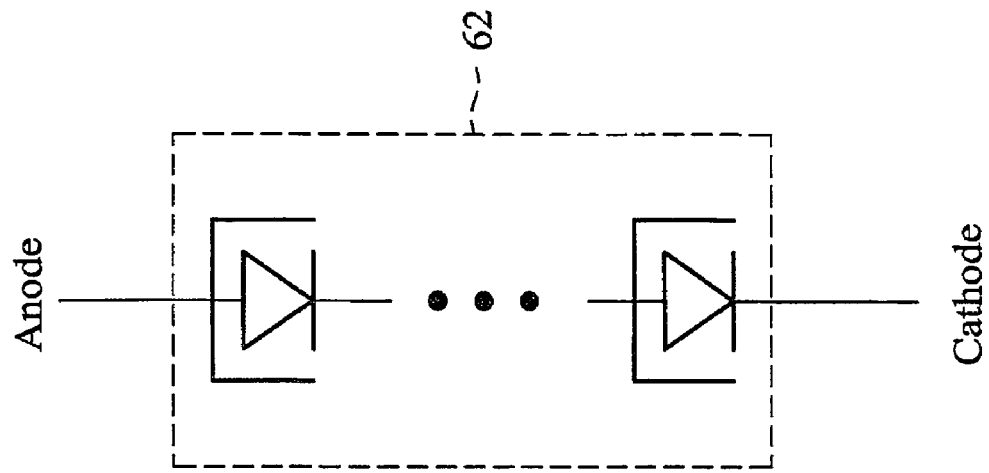
FIGS. 13A and 13B are two symbols to respectively refer to the diode and the diode string according to the present.
Figure 13A:
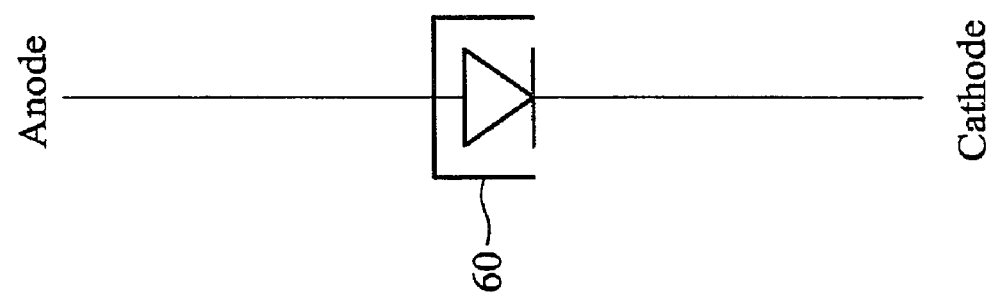

FIGS. 13A and 13B are two symbols to respectively refer to the diode and the diode string according to the present invention. Hereinafter, symbol 60 in FIG. 13A represents a diode according the present invention and could be anyone of FIGS. 7, 8, and 9. Symbol 62 in FIG. 13B represents a diode string according to the present invention and has at least two diodes forward connected in series.

Figure 14:
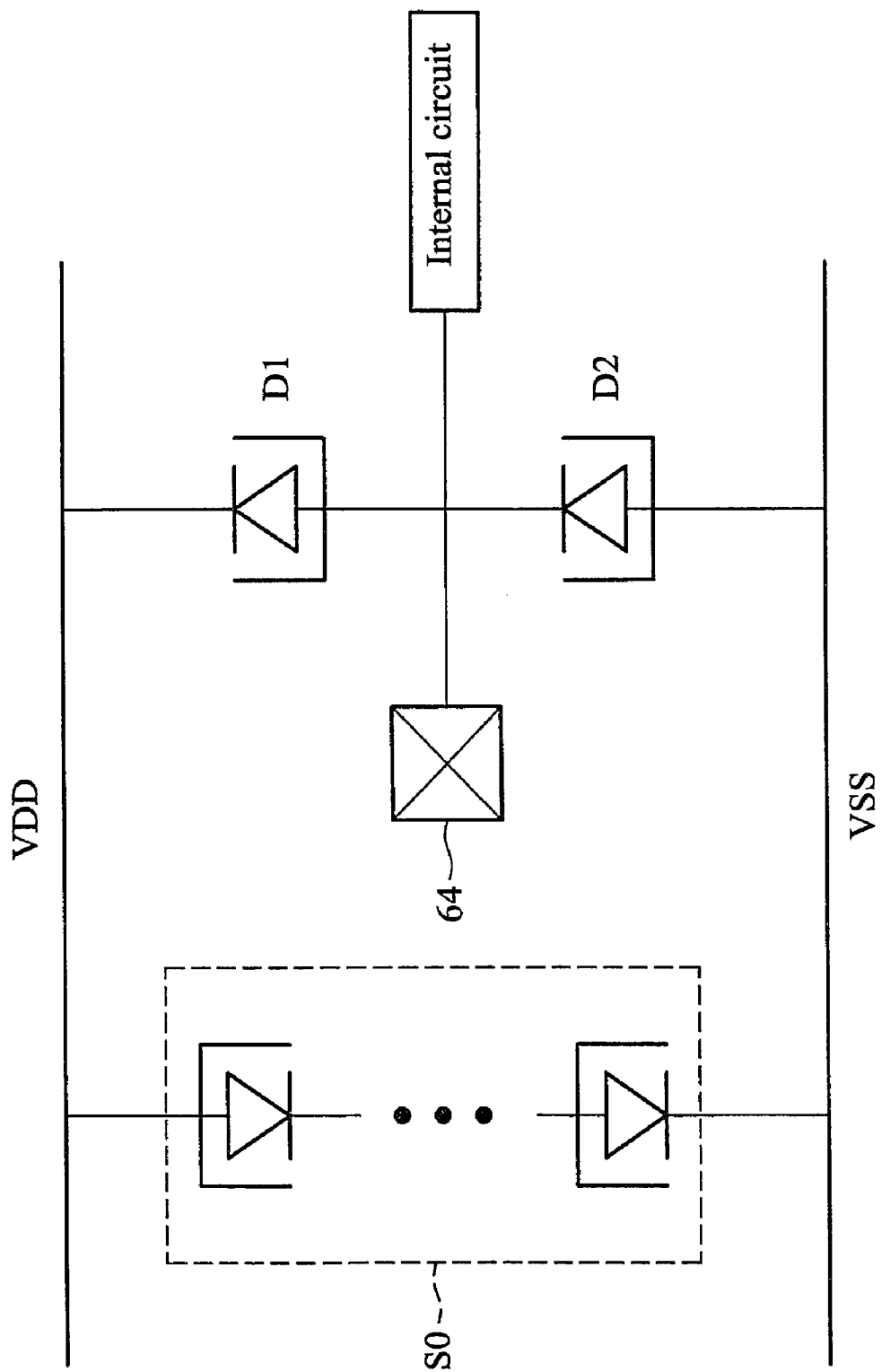
FIG. 14 illustrates an ESD protection circuit for an input/output port according to embodiments of the present invention.

FIG. 14 illustrates an ESD protection circuit for an input/output port according to embodiments of the present invention. A diode D1 is connected between a power rail VDD and an I/O pad, and a diode D2 connected between an I/O pad 64 and a VSS power rail. During normal operation, both the diodes D1 and D2 are reverse biased. A diode string S0 is connected between the VDD and VSS power rails, with diodes therein forward biased during normal operation. When an ESD pulse relatively positive to the VSS power rail occurs at the I/O pad 64, ESD charges can be released through the I/O pad 64, the diode D1, the VDD power rail and the diode string S0, and to the VSS power rail, thereby protecting internal circuits from ESD damage. Since diodes D1 and D2 are forward biased to conduct ESD current, they can be small in size. This ESD protection circuit is especially suitable for radio frequency (RF) integrated circuits (ICs). As shown in FIG. 14, only two small diodes D1 and D2 are additionally connected to the I/O pad 64, adding little capacitance loading and significant diminishing influence of the high frequency response on the I/O port.

Figure 15:
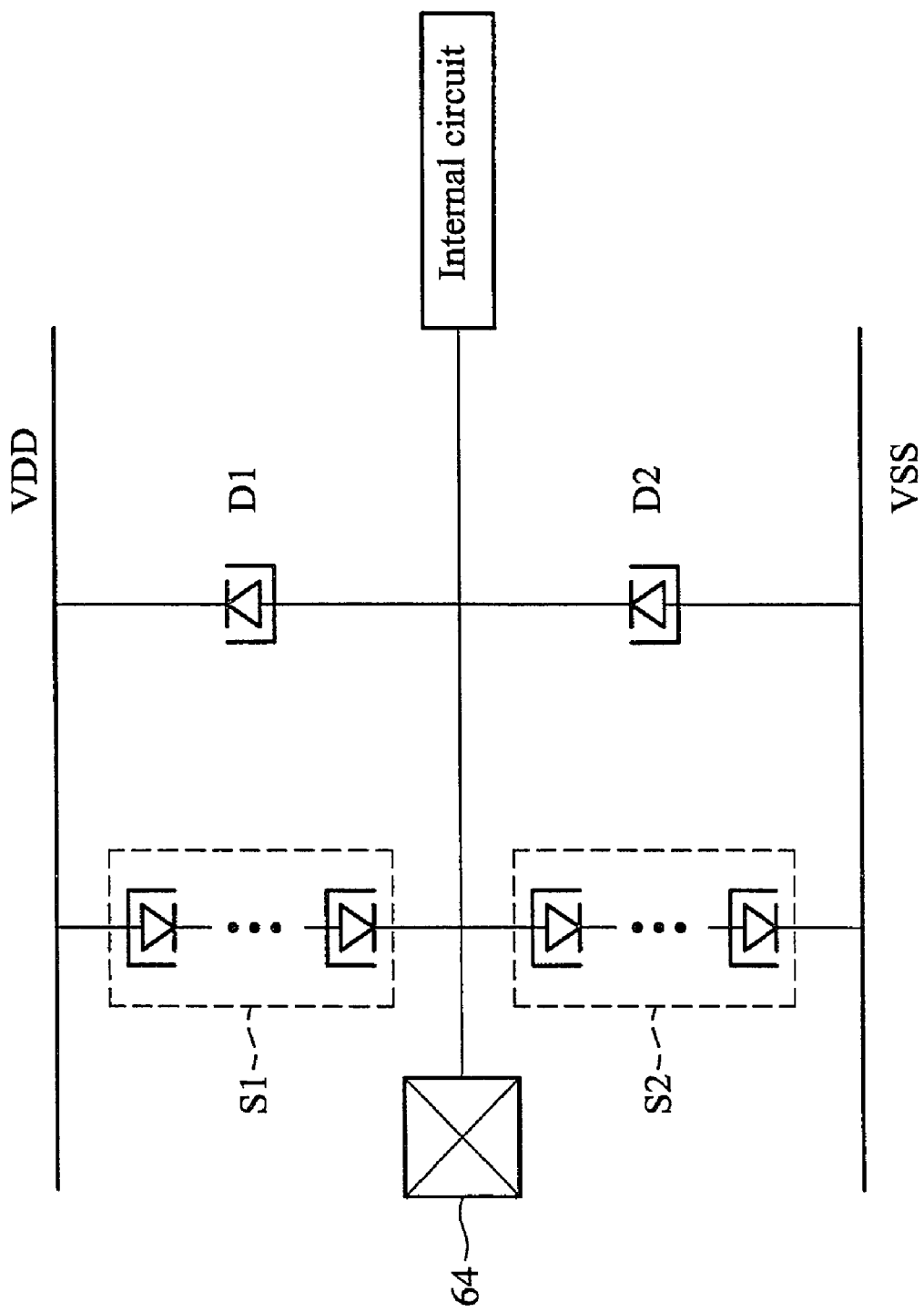
FIG. 15 illustrates another ESD protection circuit for an input/output port according to embodiments of the present invention.

FIG. 15 illustrates another ESD protection circuit for an input/output port according to embodiments of the present invention. A diode D1 and a diode string S1 are connected in parallel between the VDD power rail and an I/O pad 64 while a diode D2 and a diode string S2 are connected in parallel between the VSS power rail and the I/O pad 64. During normal operation, both diodes D1 and D2 are reverse biased, both diode strings S1 and S2 are forward biased, and all diodes D1 and D2 and diode strings S1 and S2 are open circuits. When an ESD pulse relatively positive to the VSS power rail occurs at the I/O pad 64, ESD charges can be released through the forward biased diode string S2 and to the VSS power rail, thereby protecting internal circuits from ESD damage.

Figure 16:
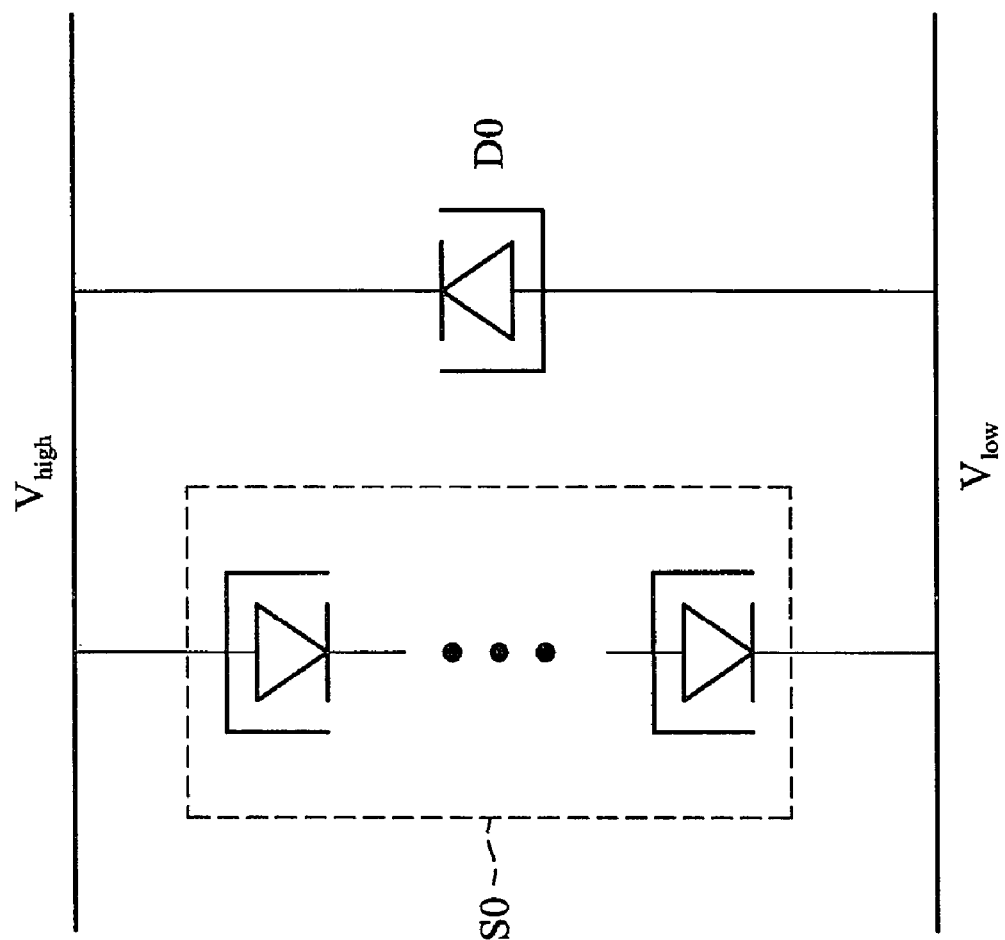
FIG. 16 illustrates a power rail clamping circuit according to embodiments of the present invention.

FIG. 16 illustrates a power rail clamping circuit according to the present invention. A diode D0 and a diode string S0 are connected in parallel between a $V_{high}$ power rail and a $V_{low}$ power rail. During normal operation, the diode D0 is reverse biased and the diode string S0 forward biased. When an ESD pulse relatively positive/negative to the $V_{low}$ power rail occurs at the $V_{high}$ power rail, ESD charges can be released through the forward biased diode string S0/diode D0 and to the VSS power rail, thereby protecting internal circuits from ESD damage.

Figure 17:
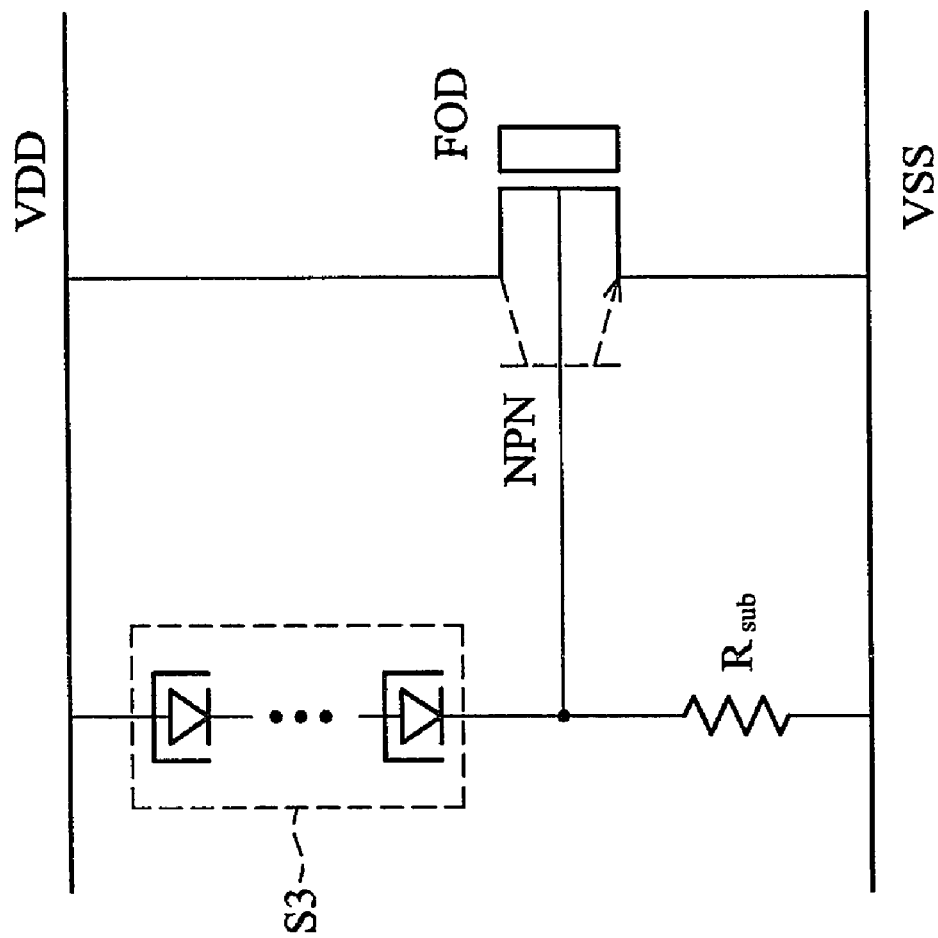
FIG. 17 illustrates another power rail clamping circuit according to embodiments of the present invention, utilizing substrate triggering.
Figure 18:
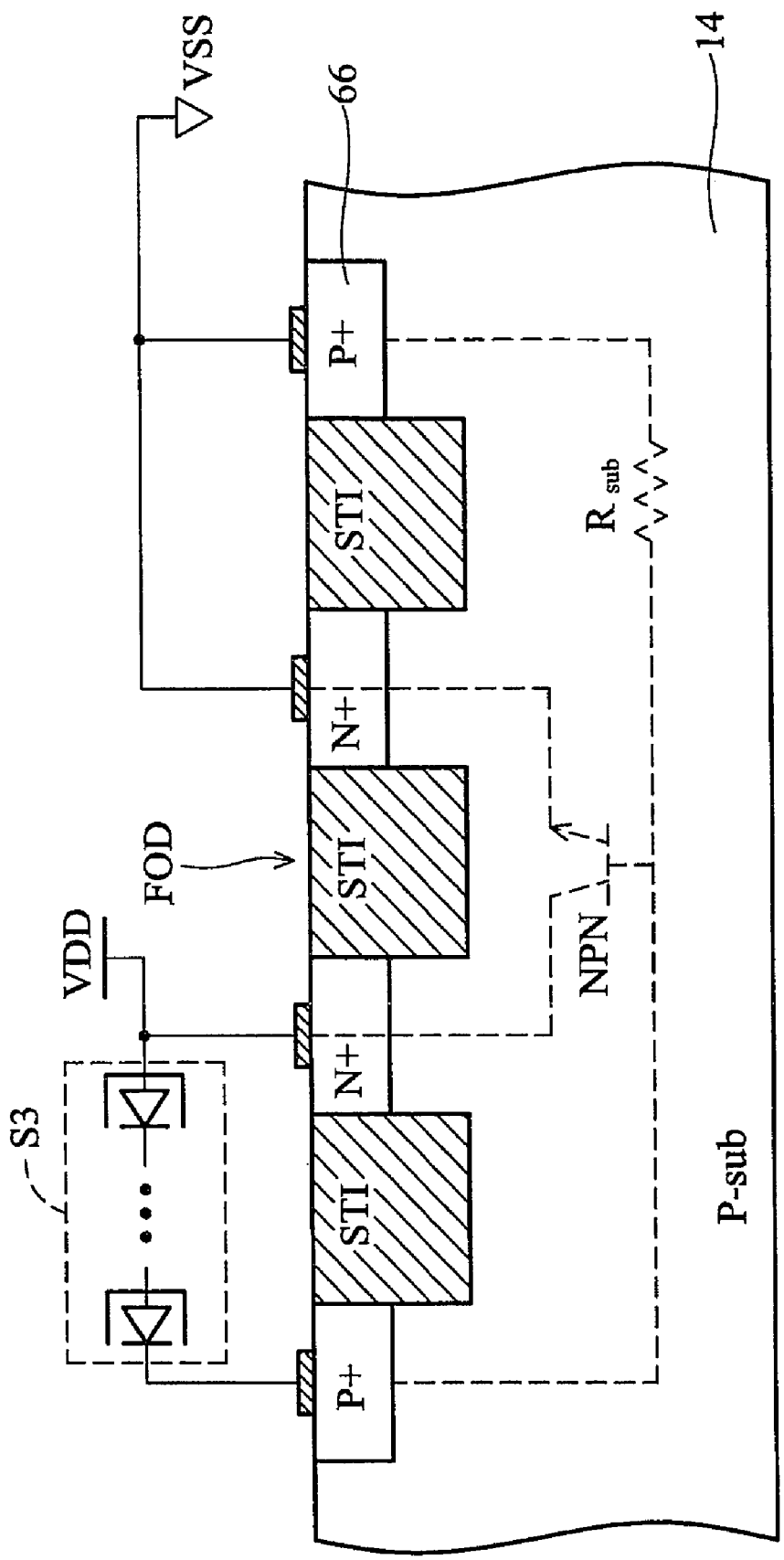
FIG. 18 is a cross section of a wafer utilizing the power rail clamping circuit of FIG. 17.

FIG. 17 illustrates another power rail clamping circuit according to embodiments of the present invention, utilizing substrate triggering. FIG. 18 is a cross section of a wafer utilizing the power rail clamping circuit of FIG. 17. In FIG. 17, the primary discharge element is a field oxide MOS transistor FOD connected between VDD and VSS power rails. A diode string S3 and a resistor $R_{sub}$ are connected in series between the two power rails. The connection node between the diode string S3 and the resister $R_{sub}$ is also connected to the base of a parasitic NPN BJT under FOD. In FIG. 18, the resistor $R_{sub}$ is a spread resistor of the substrate 14 disposed between the base of the NPN BJT and a P+ region 66, a contact of the P substrate 14.

During normal operation, activation voltage of the diode string S3 exceeds the voltage difference between the VDD and VSS power rails, and, as a result, the diode string S3 and the PNP BJT under FOD remain open. During an ESD event, activation of the diode string S3 conducts small ESD current through the resistor $R_{sub}$, and when voltage drop cross the resistor $R_{sub}$ is sufficient, the NPN BJT is activated, conducting large ESD current from the VDD power rail, through the parasitic NPN BJT, and to the VSS power rail.

While the invention has been described by way of example and in terms of the preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus, comprising:
   a semiconductor substrate of a first conductivity type;
   a buried layer of a second conductivity type formed in the semiconductor substrate;
   a well of the first conductivity type formed on the buried layer;
   a connection region of the second conductivity type formed on the buried layer;
   two isolation regions, respectively formed in the substrate on two sides of the buried layer, wherein at least one of the isolation regions extends further into the substrate than the buried layer, and wherein the isolation regions together with the buried layer isolate the well and the connection region from the semiconductor substrate;
   a first doped region of the second conductivity type formed in the well and configured to provide a first electrode of a first diode;
   a second doped region of the second conductivity type formed at least partially in the connection region; and
   a third doped region of the first conductivity type formed at least partially in the well and contacting the second doped region;
   wherein the connection region and the well are configured to be electrically connected and to provide a second electrode of the first diode.

2. The apparatus of claim 1, further comprising two shallow trench isolation structures adjacent to the first and second doped regions, respectively.

3. The apparatus of claim 1, further comprising a layer formed on and electrically coupling the second and third doped regions.

4. The apparatus of claim 1, further comprising a shallow trench isolation structure formed in the well between the first and third doped regions.

5. The apparatus of claim 1, wherein the first and second conductivity types are P-type and N-type, respectively, and wherein the first electrode is the cathode of the first diode and the second electrode is the anode of the first diode.

6. The apparatus of claim 1, wherein the second doped region extends into the well.

7. The apparatus of claim 1, wherein the apparatus is formed by a BiCMOS process, and wherein the first and second conductivity types are P-type and N-type, respectively.

8. The apparatus of claim 1, wherein the apparatus comprises a diode string that includes the first diode.

9. The apparatus of claim 8, wherein the diode string includes at least a second diode having a different structure from the first diode.

10. The apparatus of claim 1, further comprising:
a first power rail;
a second power rail;
a diode string coupled between the first and second power rails; and
an I/O pad coupled to the first and second power rails by respective diodes.

11. The apparatus of claim 10, wherein the diode string includes the first diode.

12. The apparatus of claim 10, wherein the respective diode between the I/O pad and the first power rail is the first diode.

13. The apparatus of claim 10, wherein the respective diode between the I/O pad and the second power rail is the first diode.

14. The apparatus of claim 11, wherein the respective diodes between the I/O pad and the first and second power rails have the same structure as the first diode.

15. The apparatus of claim 10, wherein the first power rail is a VDD power rail, and wherein the second power rail is a VSS power rail.

16. The apparatus of claim 1, further comprising:
an I/O pad;
a first power rail;
a first diode string coupled between the I/O pad and the first power rail;
a second power rail;
a second diode string coupled between the I/O pad and the second power rail; and
respective single diodes between the I/O pad and the first and second power rails.

17. The apparatus of claim 16, wherein either the first or second diode string includes the first diode.

18. The apparatus of claim 16, wherein the respective diode between the I/O pad and either the first or second power rail is the first diode.

19. The apparatus of claim 1, further comprising:
a first power rail;
a second power rail;
a diode string coupled between the first and second power rails that includes the first diode; and
a second diode coupled between the first and second power rails.

20. The apparatus of claim 1, further comprising:
a first power rail;
a second power rail; and
a diode string coupled, forward-biased, between the first and second power rails;
wherein the first diode is coupled, reverse-biased, between the first and second power rails.

21. An apparatus, comprising:
a semiconductor substrate of a first conductivity type;
a buried layer of a second conductivity type formed in the semiconductor substrate;
a well of the first conductivity type formed on the buried layer;
a connection region of the second conductivity type formed on the buried layer;
two isolation regions, respectively formed in the substrate on two sides of the buried layer, wherein at least one of the isolation regions extends further into the substrate than the buried layer, and wherein the isolation regions together with the buried layer isolate the well and the connection region from the semiconductor substrate;
a first doped region of the second conductivity type formed in the well and configured to provide a first electrode of a first diode;
a second doped region of the second conductivity type formed at least partially in the connection region;
a third doped region of the first conductivity type formed in the well; and
a first dummy gate formed on the well;
wherein the connection region and the well are configured to be electrically connected and to provide a second electrode of the first diode.

22. The apparatus of claim 21, wherein the first dummy gate is formed between the first and third doped regions.

23. The apparatus of claim 21, wherein the first dummy gate is formed between the second and third doped regions.

24. The apparatus of claim 21, wherein the dummy gate is a polysilicon gate.

25. The apparatus of claim 22, further comprising a second dummy gate formed between the second and third doped regions.

26. The apparatus of claim 21, wherein the apparatus is formed by a BiCMOS process.

27. The apparatus of claim 21, wherein the apparatus comprises a diode string that includes the first diode.

28. The apparatus of claim 27, wherein the diode string includes at least one diode having a different structure from the first diode.

29. The apparatus of claim 21, further comprising:
a first power rail;
a second power rail;
a diode string coupled between the first and second power rails;
an I/O pad coupled to the first and second power rails by respective diodes.

30. The apparatus of claim 29, wherein the diode string includes the first diode.

31. The apparatus of claim 29, wherein the respective diode between the I/O pad and the first power rail is the first diode.

32. The apparatus of claim 29, wherein the respective diode between the I/O pad and the second power rail is the first diode.

33. The apparatus of claim 30, wherein the respective diodes between the I/O pad and the first and second power rails have the same structure as the first diode.

34. The apparatus of claim 29, wherein the first power rail is a VDD power rail, and wherein the second power rail is a VSS power rail.

35. The apparatus of claim 21, further comprising:
an I/O pad;
a first power rail;
a first diode string coupled between the I/O pad and the first power rail;
a second power rail;

a second diode string coupled between the I/O pad and the second power rail; and respective single diodes between the I/O pad and the first and second power rails.

36. The apparatus of claim 35, wherein either the first or second diode string includes the first diode.

37. The apparatus of claim 35, wherein the respective diode between the I/O pad and either the first or second power rail is the first diode.

38. The apparatus of claim 21, further comprising:
a first power rail;
a second power rail;
a diode string coupled between the first and second power rails that includes the first diode; and
a second diode coupled between the first and second power rails.

39. The apparatus of claim 21, further comprising:
a first power rail;
a second power rail; and
a diode string coupled, forward-biased, between the first and second power rails;
wherein the first diode is coupled, reverse-biased, between the first and second power rails.

40. An apparatus, comprising:
a first power rail configured to receive a first voltage;
a second power rail configured to receive a second voltage;
a diode string;
a substrate having formed therein a resistive element between first and second doped regions formed at the surface of the substrate, wherein the substrate and the first and second doped regions have a first conductivity type;
a field oxide MOS-type transistor formed at the surface of the substrate between the first and second doped regions, wherein the field oxide MOS-type transistor comprises:
third and fourth doped regions having a second conductivity type; and
an isolation element formed between the third and fourth doped regions;
wherein the diode string is coupled between the first power rail and the first doped region, and wherein the third doped region is coupled to the first power rail; and
wherein the second and fourth doped regions are coupled to the second power rail.

41. The apparatus of claim 40, wherein the first and second conductivity types are P type and N type, respectively, wherein the first voltage is positive relative to the second voltage, and wherein the substrate and the third and fourth doped regions form a parasitic bipolar junction transistor (BJT).

42. The apparatus of claim 41, wherein the diode string has an activation voltage that, during normal operation of the apparatus, exceeds the difference between the first and second voltages.

43. The apparatus of claim 42, wherein, during an ESD event, the diode string is configured to activate, causing ESD current to flow through the resistive element and to activate the parasitic BJT to conduct ESD current from the first power rail to the second power rail.

44. The apparatus of claim 40, wherein the diode string includes at least two diodes having different structures.

45. The apparatus of claim 40, wherein the diode string includes a plurality of means for providing unidirectional current flow.

46. The apparatus of claim 45, wherein at least two of the plurality of means have different structures.

* * * * *